United States Patent
Heo et al.

(10) Patent No.: US 9,110,628 B2
(45) Date of Patent: *Aug. 18, 2015

(54) IMAGE PROCESSING BOARD AND DISPLAY APPARATUS HAVING THE SAME

(75) Inventors: Jae Cheol Heo, Suwon-si (KR); Young Dae Kim, Seoul (KR); Do Yong Kim, Suwon-si (KR); Eun Young Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 214 days.

This patent is subject to a terminal disclaimer.

(21) Appl. No.: 13/111,284

(22) Filed: May 19, 2011

(65) Prior Publication Data

US 2012/0033391 A1    Feb. 9, 2012

(30) Foreign Application Priority Data

Aug. 9, 2010  (KR) ........................ 10-2010-0076648

(51) Int. Cl.
| | |
|---|---|
| H05K 5/00 | (2006.01) |
| H05K 7/00 | (2006.01) |
| G06F 1/16 | (2006.01) |
| H04N 5/64 | (2006.01) |

(52) U.S. Cl.
CPC ............ *G06F 1/1601* (2013.01); *G06F 1/1607* (2013.01); *H04N 5/64* (2013.01)

(58) Field of Classification Search
CPC ..... G06F 1/1656; G06F 1/186; G06F 1/1601; G06F 1/1607; H04N 5/64
USPC ..................................... 361/810; 439/79, 638
See application file for complete search history.

(56) References Cited

U.S. PATENT DOCUMENTS

| | | | | |
|---|---|---|---|---|
| 4,756,694 | A | * | 7/1988 | Billman et al. ................. 439/61 |
| 5,292,265 | A | * | 3/1994 | Chen et al. .................... 439/876 |
| 5,511,985 | A | * | 4/1996 | Noschese et al. ............. 439/157 |
| 5,679,013 | A | * | 10/1997 | Matsunaga et al. ........... 439/144 |
| 5,752,857 | A | * | 5/1998 | Knights ......................... 439/638 |
| 5,980,276 | A | * | 11/1999 | Arita et al. .................... 439/131 |
| 6,288,908 | B1 | * | 9/2001 | Saitoh .......................... 361/785 |
| 7,088,400 | B2 | | 8/2006 | Lee et al. |
| 7,473,140 | B2 | * | 1/2009 | Guan et al. .................... 439/637 |
| 7,833,051 | B2 | * | 11/2010 | Huang et al. ............... 439/541.5 |

(Continued)

FOREIGN PATENT DOCUMENTS

| | | | | |
|---|---|---|---|---|
| CH | WO 02/25943 | * | 3/2002 | ............... H04N 5/64 |
| WO | WO 0225943 A1 | | 3/2002 | |

OTHER PUBLICATIONS

Extended European Search Report issued on Jan. 3, 2012 by the European Patent Office in the corresponding European Patent Application No. 11164971.1.

(Continued)

*Primary Examiner* — Jayprakash N Gandhi
*Assistant Examiner* — Mukund G Patel
(74) *Attorney, Agent, or Firm* — Sughrue Mion, PLLC (57) ABSTRACT

An image processing board and a display apparatus having the same are provided. The image processing board includes a substrate, common input terminals installed on the substrate, and an additional input terminal selectively installed on the substrate. The additional input terminal is selectively installed on the substrate according to a type of display apparatus, and thus the image processing board may be used in various types of display apparatuses.

17 Claims, 5 Drawing Sheets

(56) References Cited

U.S. PATENT DOCUMENTS

| | | | |
|---|---|---|---|
| 7,940,336 B2* | 5/2011 | Takatori | 348/725 |
| 2002/0042213 A1* | 4/2002 | Lai | 439/67 |
| 2003/0186570 A1* | 10/2003 | Ito | 439/79 |
| 2005/0007500 A1* | 1/2005 | Lin et al. | 348/790 |
| 2009/0068898 A1* | 3/2009 | Ryu | 439/638 |
| 2011/0081790 A1* | 4/2011 | Finney et al. | 439/55 |

OTHER PUBLICATIONS

Communication dated Sep. 29, 2014 issued by the European Patent Office in counterpart European Patent Application No. 11 164 971.1.

\* cited by examiner

IMAGE PROCESSING BOARD AND DISPLAY APPARATUS HAVING THE SAME

CROSS-REFERENCE TO RELATED APPLICATION

This application claims the benefit of Korean Patent Application No. 10-2010-0076648, filed on Aug. 9, 2010 in the Korean Intellectual Property Office, the disclosure of which is incorporated herein by reference.

BACKGROUND

1. Field

Aspects of the exemplary embodiments relate to an image processing board on which a card connection terminal connected to a card containing data is installed, and a display apparatus having the same.

2. Description of the Related Art

In general, display apparatuses receive video or image data and then display a video or an image.

A display apparatus includes an exterior case, a display module installed in the case such that a front surface of the display module is exposed through an opening provided on the front surface of the case, and an image processing board installed in the case and disposed at a rear end of the display module which displays received video and image data through the display module.

Various kinds of input terminals which receive various types of data, such as video, image and sound data, are disposed on the image processing board.

SUMMARY

According to an aspect of exemplary embodiments, there is provided an image processing board on which various input terminals are disposed, the image processing board having a predetermined size or less, and a display apparatus having the same.

Additional aspects of exemplary embodiments will be set forth in part in the description which follows and, in part, will be obvious from the description.

In accordance with one aspect of an exemplary embodiment, a display apparatus includes a case unit, a display module disposed in the case unit which displays an image, and an image processing board installed in the case unit and disposed at a rear end of the display module, wherein the image processing board includes a substrate, common input terminals installed on the substrate, and an additional input terminal selectively installed on the substrate.

The additional input terminal may include a card connection terminal which receives data through a card.

The display apparatus may further include guide rails separated from the substrate and disposed on an outside surface of the case unit which guides the card to the card connection terminal.

The card connection terminal may be fixed to the substrate.

The card connection terminal may be separably installed on the substrate.

A connector to which the card connection terminal is connected may be disposed on the substrate and the card connection terminal may be separably installed to the connector.

The case unit may include a through hole through which the card connection terminal passes.

The guide rails may be disposed in parallel with the substrate.

The guide rails may be inclined at a predetermined angle relative to the substrate such that a distance between the guide rails and the substrate gradually increases as the guide rails extend to an outside surface of the case unit.

The guide rails may extended integrally from the card connection terminal.

The guide rails may include coupling protrusions connected to the case unit and the case unit may include coupling holes in which the coupling protrusions are installed.

The guide rails may include a pair of guide rails which movably support both side ends of the card.

The case unit may include a card insertion hole through which the card is separably installed on the card connection terminal.

The case unit may further include a guide part formed on the front surface of the case unit at a position adjacent to the card insertion hole so as to be inclined toward the card insertion hole, and the pair of guide rails may be disposed at both sides of the guide part.

In accordance with another aspect of an exemplary embodiment, an image processing board includes a substrate, and common input terminals installed on the substrate and an additional input terminal selectively installed on the substrate.

BRIEF DESCRIPTION OF THE DRAWINGS

These and/or other aspects of the exemplary embodiments will become apparent and more readily appreciated from the following description of the embodiments, taken in conjunction with the accompanying drawings of which.

DETAILED DESCRIPTION OF EXEMPLARY EMBODIMENTS

Reference will now be made in detail to the exemplary embodiments, examples of which are illustrated in the accompanying drawings, wherein like reference numerals refer to like elements throughout.

Hereinafter, an image processing board and a display apparatus having the same in accordance with one exemplary embodiment will be described in detail with reference to the accompanying drawings.

Figure 1:
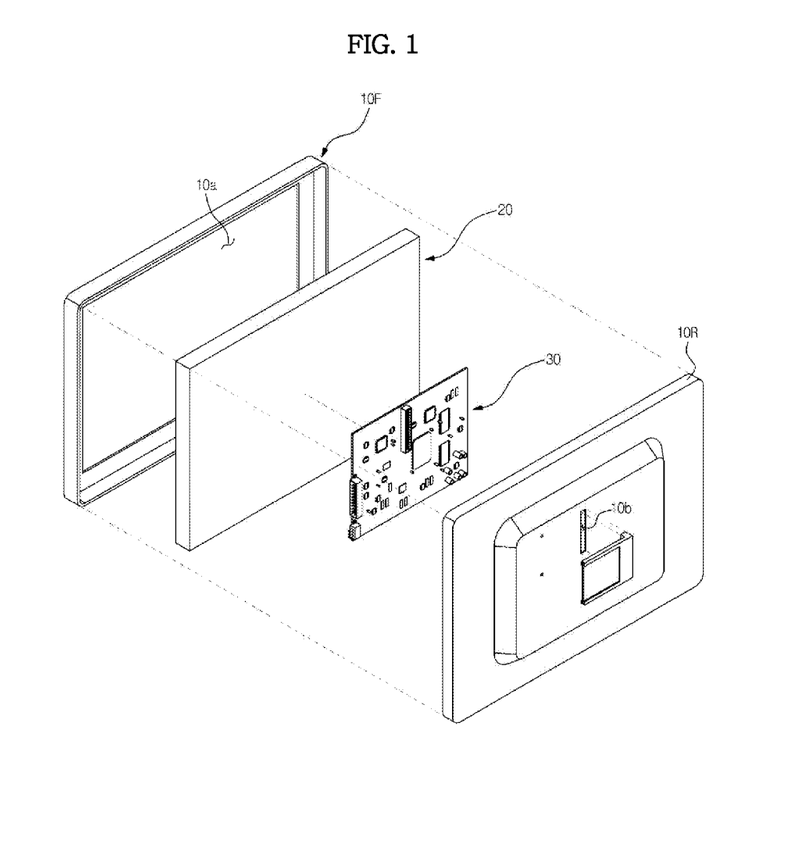
FIG. 1 is an exploded perspective view of a display apparatus in accordance with an exemplary embodiment.

As shown in FIG. 1, the display apparatus includes a case unit 10F and 10R forming the external portion or section of the display apparatus, and a display module 20. The display module 20 is disposed within the case unit 10F and 10R such that the front surface of the display module 20, on which a video and an image are displayed is displayed, is exposed through an opening 10a provided on the front surface of the case unit 10F and 10R.

The case unit 10F and 10R is formed by connecting a front case 10F and a rear case 10R. The front case 10F forms the front surface of the case unit 10F and 10R and is provided with opening 10a. The rear case 10R forms the rear surface of the case unit 10F and 10R which receives the display module 20 in a space between the front case 10F and the rear case 10R. Further, an image processing board 30, which receives video or image data and then displays a video or an image on the front surface of the display module 20, is disposed between the display module 20 and the rear case 10R.

Figure 2:
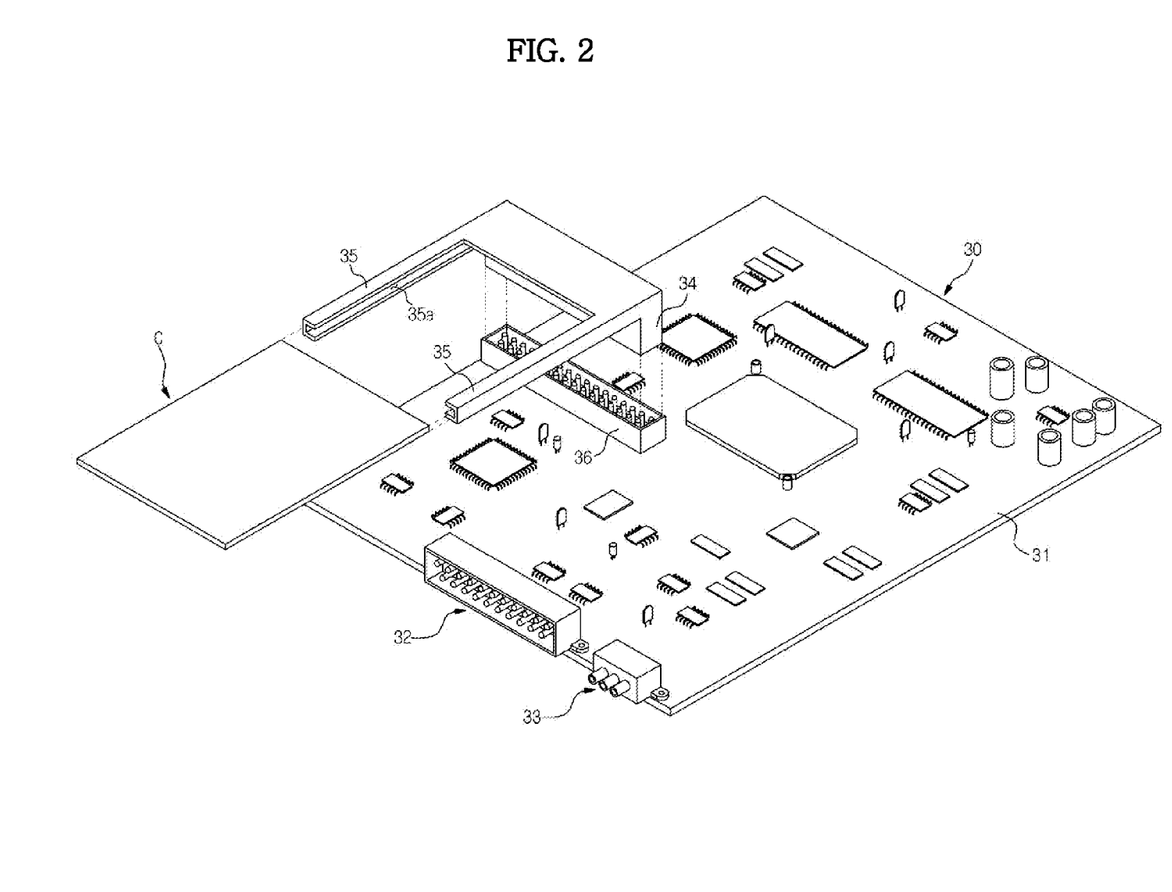
FIG. 2 is a perspective view of an image processing board disposed on the display apparatus in accordance with an exemplary embodiment.
Figure 3:
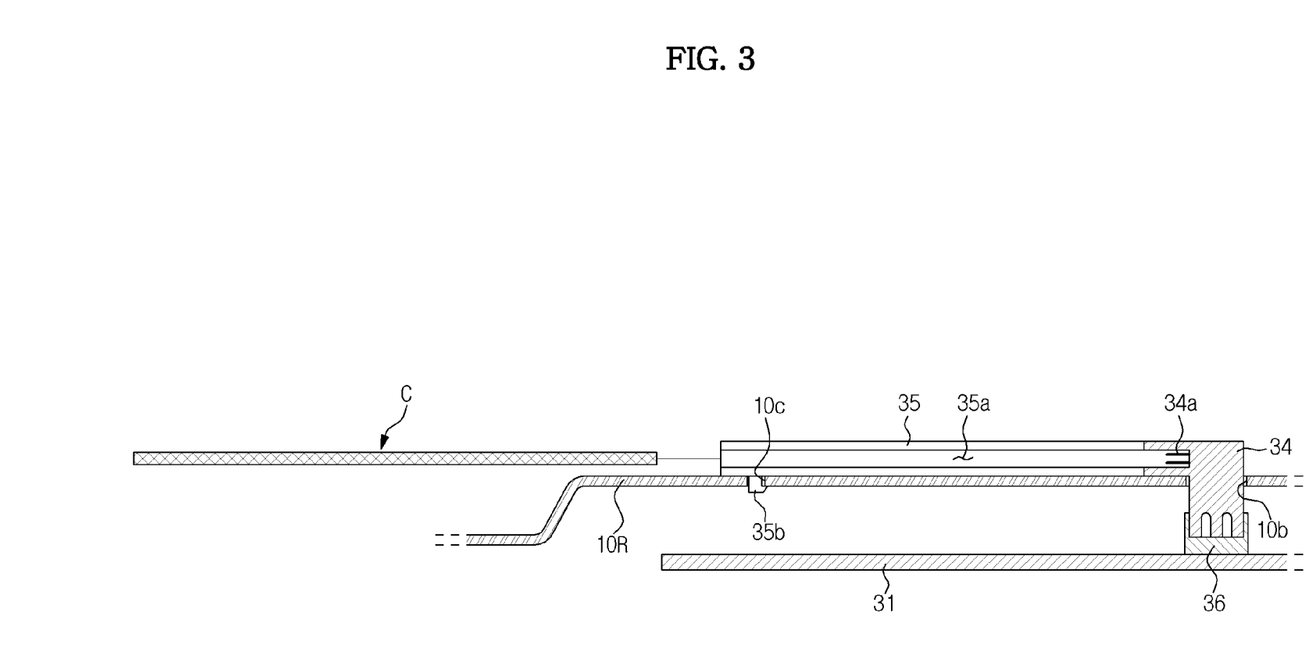
FIG. 3 is a cross-sectional view illustrating the installation of the image processing board on the display apparatus in accordance with an exemplary embodiment.

The image processing board 30, as shown in FIGS. 2 and 3, includes a substrate 31, and various kinds of input terminals 32, 33 and 34 disposed at one side of the substrate 31 which receive video, image, and sound signals. On the substrate 31 various circuit patterns are formed and various electronic components, such as a CPU, a condenser and a memory are installed.

The input terminals 32, 33 and 34 disposed on the substrate 31 include common input terminals 32 and 33, which are generally used in many regions, and an additional input terminal, which is used in a specific region. Here, the common input terminals 32 and 33 are basic elements of the image processing board 30, and are commonly installed on substrates 31 of various types of display apparatuses. The additional input terminal is selectively installed on the substrate 31 according to the type of display apparatus. The additional input terminal includes a card input terminal 34 which receives various data through a card C, such as a PCMCIA card.

If the additional input terminal is selectively installed on the substrate 31, the additional input terminal may be selectively installed on the substrate 31 according to the type of display apparatus, and thus one common substrate 31 may be used in various or different types of display apparatuses.

Further, if the additional input terminal is not needed, the substrate 31 without the additional input terminal may be used in different types of display apparatuses and thus the space occupied by the additional input terminal on the substrate 31 may be more efficiently used.

The card connection terminal 34 is selectively installed on the substrate 31 according to types of display apparatuses. The display apparatus includes guide rails 35 which guide the card C to the card connection terminal 34 so as to easily connect the card C to the card connection terminal 34.

A connection part 34a which the card C is connected is provided at one side of the rear end of the card connection terminal 34, and a pair of guide rails 35, each of which is provided with a rail groove 35a, is provided which guides both side ends of the card C. In this exemplary embodiment, the two guide rails 35 extend integrally from both sides of the connection part 34a of the card connection terminal 34, respectively.

The guide rails 35 are separated from the substrate 31 so as to be disposed in parallel with the substrate 31. If the guide rails 35 are separated from the substrate 31, a circuit pattern may be formed or electronic components may be installed at a region of the substrate 31 corresponding to the guide rails 35. Therefore, a space occupied by the card connection terminal 34 is restricted to a region of the substrate 31 to which the card connection terminal 34 is connected, and thus a wider variety of input terminals 32, 33 and 34 may be disposed on the substrate 31 having the same size. Further, if the various input terminals 32, 33 and 34 are disposed on the substrate 31 of the image processing board 30, one image processing board 30 may be used in common in various types of display apparatuses.

The card connection terminal 34 is separably installed on the substrate 31, and thus may be installed on the substrate 31 only as needed. For this purpose, a connector 36 on which the card connection terminal 34 is separably installed is disposed on the substrate 31, and a through hole 10b, through which the card connection terminal 34 passes so as to be installed on the connector 36, is provided on the case unit 10F and 10R. In order to install the card connection terminal 34 provided with the guide rails 35 formed integrally therewith on the rear case 10R, coupling protrusions 35b protrude from the guide rails 35 and coupling holes 10c, through which the coupling protrusions 35b pass so as to be coupled with the coupling holes 10c, are provided on the rear case 10R.

Therefore, if the card connection terminal 34 is used, the card connection terminal 34 provided with the guide rails 35 is installed on the rear case 10R by connecting the card connection terminal 34 to the connector 36 by inserting the card connection terminal 34 into the through hole 10b and by coupling the coupling protrusions 35b with the coupling holes 10c, simultaneously. Thereafter, the card C is inserted into the card connection terminal 34 by guiding the card C along the guide rails 35. Thereby, the image processing board 30 may read data stored in the card C. On the other hand, if the card connection terminal 34 is not needed, the display apparatus can still be used even when the card connection terminal 34 is not installed.

Hereinafter, an image processing board in accordance with another exemplary embodiment will be described in detail with reference to the accompanying drawings.

Figure 4:
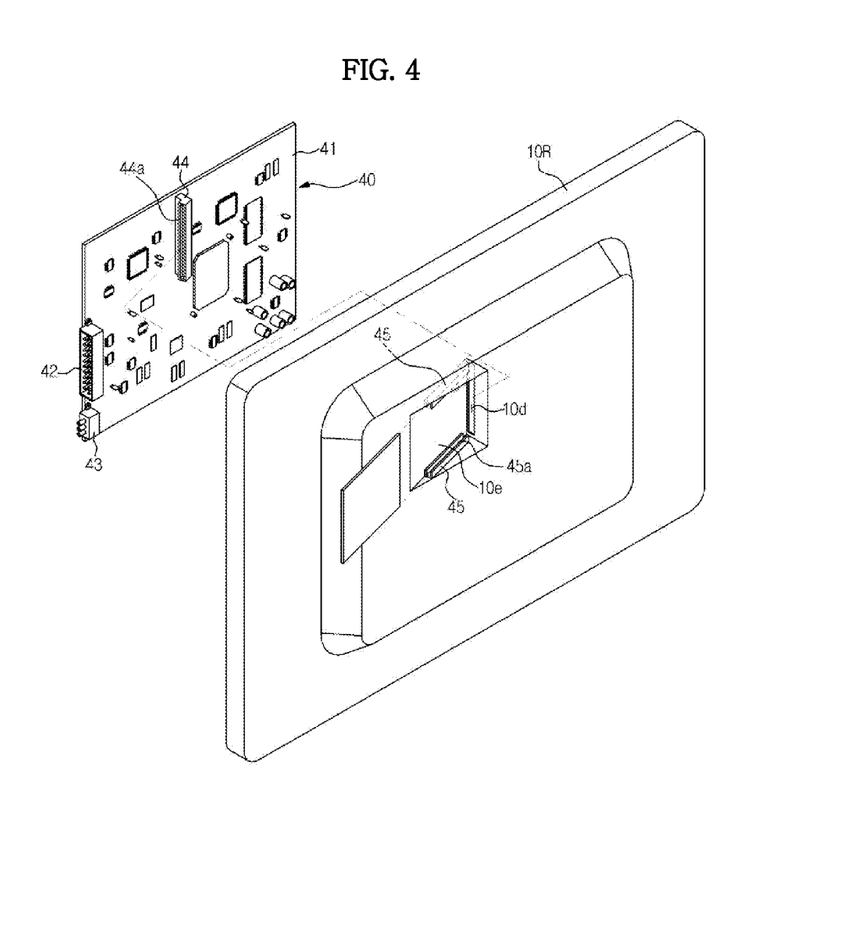
FIG. 4 is a perspective view illustrating an image processing board installed on a display apparatus in accordance with another exemplary embodiment.
Figure 5:
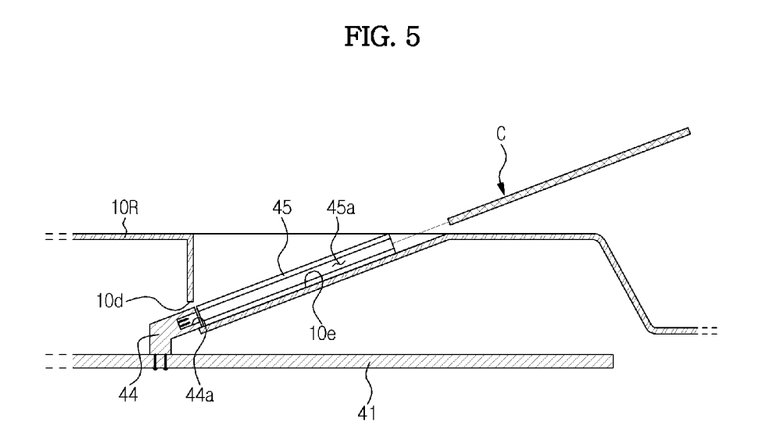
FIG. 5 is a side view illustrating the installation of the image processing board on the display apparatus in accordance with another exemplary embodiment.

As shown in FIGS. 4 and 5, the display apparatus in accordance with this exemplary embodiment includes an image processing board 40 including a substrate 41 and a plurality of input terminals 42, 43 and 44 disposed on the substrate 41, and a rear case 10R which covers the rear portion of the image processing board 40.

The input terminals 42, 43 and 44 include a card connection terminal 44 which receives data through a card C, and a card insertion hole 10d, through which the card C is installed on the card connection terminal 44. The card insertion hole 10d is provided on the rear case 10R.

The card connection terminal 44 is fixed to the substrate 41, and a connection part 44a to which the card C is connected is provided at one side of the card connection terminal 44. Guide rails 45 guide the card C to the card connection terminal 44 through the card insertion hole 10d are provided on the case 10R. In this exemplary embodiment, a pair of guide rails 45, which are disposed so as to face each other, and each of which is provided with a rail groove 45a, is provided so as to guide the card C to the card connection terminal 44.

In this exemplary embodiment, a guide part 10e is formed at an angle on the rear surface of the rear case 10R and is inclined at an angle relative to the card insertion hole 10d. In addition two guide rails 45 are disposed at both sides of the guide part 10e so as to face each other such that a distance of the guide rails 45 relative to the substrate 41 gradually increases as the guide rails 45 extend toward the exterior of the rear case 10R.

As described above, the two guide rails 45 are disposed on the rear case 10R and thus only the card connection terminal 44 is installed on the substrate 41, thereby allowing the area of the substrate 41 to be more efficiently used. Thus, a wider variety of input terminals 42, 43 and 44 may be disposed on the substrate 41 and one substrate 41 may be used in common in various types of display apparatuses.

Although the above exemplary embodiments describe the card input terminal 34 as the additional input terminal, the additional input terminal is not limited thereto. That is, various kinds of input terminals may be used as the additional input terminal.

As is apparent from the above description, on a substrate of an image processing board in accordance with one exemplary embodiment, common input terminals which are generally used and an additional input terminal which is selectively installed according to the type of display apparatuses are installed. Therefore, the image processing board may be commonly used in different types of display apparatuses.

Although a few exemplary embodiments have been shown and described, it would be appreciated by those skilled in the art that changes may be made in these exemplary embodiments without departing from the principles and spirit of the inventive concept, the scope of which is defined in the claims and their equivalents.

What is claimed is:

1. A display apparatus comprising:
a case unit;
a display module disposed in the case unit which displays an image;
an image processing board installed in the case unit and disposed at a rear side of the display module,
wherein the image processing board includes a substrate, common input terminals and a connector installed on the substrate and
a card connection terminal provided independent of the substrate and detachably inserted into the connector, the card connection terminal having guide rails configured to guide a card received from exterior of the case unit and disposed outside of the case unit,
wherein the connector receives data from the card guided by the guide rails of the card connection terminal,
wherein a portion of the card connection terminal is inserted into/separated from the connector so the guide rails of the card connection terminal are separated from the substrate,
wherein when the portion of the card connection terminal is inserted into the connector, the guide rails of the card connection terminal are immoveable with respect to the substrate, and
wherein the guide rails are extended from the card connection terminal and formed integrally with the card connection terminal.

2. The display apparatus according to claim 1, wherein the guide rails are inclined at a predetermined angle relative to the substrate.

3. The display apparatus according to claim 1, wherein the case unit includes a through hole through which the card connection terminal passes.

4. The display apparatus according to claim 1, wherein the guide rails are disposed in parallel with the substrate.

5. The display apparatus according to claim 1, wherein the guide rails are inclined at a predetermined angle relative to the substrate such that a distance between the guide rails and the substrate is gradually increased as the guide rails extend toward an exterior surface of the case unit.

6. The display apparatus according to claim 1, wherein:
the guide rails include coupling protrusions connected to the case unit; and
the case unit includes coupling holes in which the coupling protrusions are installed.

7. The display apparatus according to claim 1, wherein the guide rails include a pair of guide rails which movably support both side ends of the card.

8. The display apparatus according to claim 7, wherein the case unit includes a card insertion hole through which the card passes so as to be separably installed on the card connection terminal.

9. The display apparatus according to claim 8, wherein:
the case unit further includes a guide part formed on a rear surface of the case unit at a position adjacent to the card insertion hole so as to be inclined toward the card insertion hole; and
the pair of guide rails is disposed at both sides of the guide part.

10. The display apparatus according to claim 1, wherein the card connection terminal having guide rails is a single piece of rigid structure.

11. An image processing apparatus comprising:
a case unit;
an image processing board installed in the case unit and including a substrate, common input terminals and a connector installed on the substrate; and
a card connection terminal provided independent of the substrate and detachably inserted into the connector, the card connection terminal having guide rails configured to guide a card received from exterior of the case unit and disposed outside of the case unit,
wherein the connector receives data from the card guided by the guide rails of the card connection terminal,
wherein a portion of the card connection terminal is inserted into/separated from the connector so the guide rails of the card connection terminal are separated from the substrate,
wherein when the portion of the card connection terminal is inserted into the connector, the guide rails of the card connection terminal are immoveable with respect to the substrate, and
wherein the guide rails are extended from the card connection terminal and the card connection terminal having guide rails is a single piece of rigid structure.

12. The image processing board according to claim 11, wherein the guide rails are inclined at a predetermined angle relative to the substrate.

13. The image processing apparatus according to claim 11, wherein the guide rails are disposed in parallel with the substrate.

14. The image processing apparatus according to claim 11, wherein the guide rails are inclined relative to the substrate such that a distance between the guide rails and the substrate gradually increases as the guide rails extend to an exterior surface of the case unit.

15. The image processing apparatus according to claim 11, wherein the guide rails are extended integrally from the card connection terminal.

16. The image processing apparatus according to claim 11, wherein the guide rails include a pair of guide rails which movably support both side ends of the card.

17. An image processing board comprising:
a substrate;
input terminals installed on the substrate, wherein at least one of the input terminals is selectively installed on the substrate, and wherein the at least one selectively installed input terminal includes a card connection terminal which receives data through a card; and
guide rails separated from the substrate and disposed on an outside surface of a case unit housing the image processing board, wherein the guide rails guide the card to the card connection terminal,
wherein the guide rails are configured to be detached from the substrate when the at least one selectively installed input terminal including the card connection terminal is detached from the case unit, wherein when the card connection terminal is mounted to the case unit, the guide rails are immoveable with respect to the case unit, and wherein the guide rails are formed integrally with the card connection terminal.

* * * * *